United States Patent [19]

Lawson et al.

[11] 4,277,751
[45] Jul. 7, 1981

[54] LOW-POWER MAGNETOMETER CIRCUIT WITH CONSTANT CURRENT DRIVE

[75] Inventors: Kenneth D. Lawson, Cataumdet; Neil L. Brown, Falmouth, both of Mass.

[73] Assignee: Neil Brown Instruments Systems, Inc., Cataumet, Mass.

[21] Appl. No.: 947,254

[22] Filed: Sep. 29, 1978

[51] Int. Cl.³ ................ G01R 33/04; G01C 17/28
[52] U.S. Cl. .................................... 324/254; 33/361
[58] Field of Search ............ 324/244, 245, 247, 253, 324/254; 33/361; 361/143, 146, 152, 153

[56] References Cited

U.S. PATENT DOCUMENTS

| | | | |
|---|---|---|---|
| 3,509,424 | 4/1970 | Inouye | 324/254 |
| 3,626,280 | 12/1971 | Van Englehoven et al. | 324/253 |
| 3,678,593 | 7/1972 | Baker et al. | 33/361 |
| 3,696,518 | 10/1972 | Leat | 33/361 |
| 3,936,949 | 2/1976 | Devaud | 33/361 |

OTHER PUBLICATIONS

"Tech Brief 70-10345 Two Axis Flux Gate Magnetometer" NASA Technical Support Package No. TSP 70-10345, 1970.

T. R. Sanderson, "A Three-Axis Magnetometer with Digital Readout, Suitable for Balloon Borne Apparatus" 1972, Nuclear Instruments and Methods No. 105, pp. 371–376.

*Primary Examiner*—Gerard R. Strecker
*Assistant Examiner*—Walter E. Snow
*Attorney, Agent, or Firm*—Sewall P. Bronstein

[57] ABSTRACT

The drive signal applied to the drive winding of a magnetometer is provided by a voltage controlled oscillator. The average current flowing through the drive winding is monitored, and a signal representative of the average current is applied to the input of the voltage control oscillator. The sense windings of the magnetometer are connected to a servo-loop which causes a current to flow in the sense windings which produces a magnetic field cancelling the sensed components of the earth's magnetic field. The magnetometer uses a drive signal which saturates the core for only a short duration of time thereby reducing the power required by the magnetometer while ensuring complete saturation of the core.

19 Claims, 3 Drawing Figures

LOW-POWER MAGNETOMETER CIRCUIT WITH CONSTANT CURRENT DRIVE

FIELD OF THE INVENTION

The present invention is related to magnetometers for measuring magnetic fields, and in particular to low power magnetometer circuits.

BACKGROUND OF THE INVENTION

Magnetometers have long been used for measuring the intensities of magnetic fields. Magnetometers are available which measure magnetic field strength using both mechanical and electrical techniques. One type of electronic magnetometer, known as a fluxgate magnetometer, is frequenctly used as a compass to provide an output representative of the orientation of the magnetometer with respect to the magnetic field of the earth.

While numerous circuits are known for implementing fluxgate magnetometer compasses, these circuits frequently require an appreciable amount of power. Especially where a magnetometer must be capable of operating off a battery or other low-capacity power supply, conventional magnetometer circuits are frequently not suitable.

SUMMARY OF THE INVENTION

The present invention provides a magnetometer circuit which requires extremely low power. This circuit is suitable for being used in applications where the magnetometer must be powered for a long period of time from a battery. Such applications include, for example, instrumentation which is stationed at remote ocean locations to monitor ocean currents. Such devices require a reliable and low power device to provide an electronic indication of the alignment of the instrument with respect to the earth's magnetic field.

Briefly, the present invention operates in the following manner. Similarly to conventional magnetometers, a high-permeability toroidal core is circumferentially wound with a drive winding, and the drive winding is excited with an AC drive signal of sufficient amplitude to saturate the core during part of each half cycle. Two sense windings are diametrically wound around the core at right angles to one another. As the core saturates in response to the AC signal from the drive winding, the half of the core on the side where the AC field and the earth's magnetic field are in the same direction will saturate sooner than the other half. By detecting this, the sense windings provide an indication of the magnitude of the earth's magnetic field to provide a measure thereof.

In the present invention, the sense windings are connected to a servo-loop which causes a current to flow in the windings which produces a magnetic field cancelling the sensed component of the earth's magnetic field. This allows the magnetometer to use a drive signal which saturates the core for only a short duration of time. Since the power dissipation of the magnetometer is much higher during periods when the core is saturated, such a drive signal reduces the power required by the magnetometer.

The drive signal applied to the drive winding is provided by a voltage controlled oscillator. The average current flowing through the drive winding is monitored, and a signal representative of the average current is applied to the input of the voltage control oscillator. If the average current changes from a desired value, the frequency of the voltage control oscillator is increased or decreased to compensate for this change so that the period of saturation may be reliably and simply maintained at a minimum duration resulting in a low power requirement.

DESCRIPTION OF THE DRAWINGS

The operation and the advantages of the present invention will become more clear upon reading the following description of the preferred embodiment in conjunction with the accompanying drawings, of which.

DESCRIPTION OF THE PREFERRED EMBODIMENT

Figure 1:
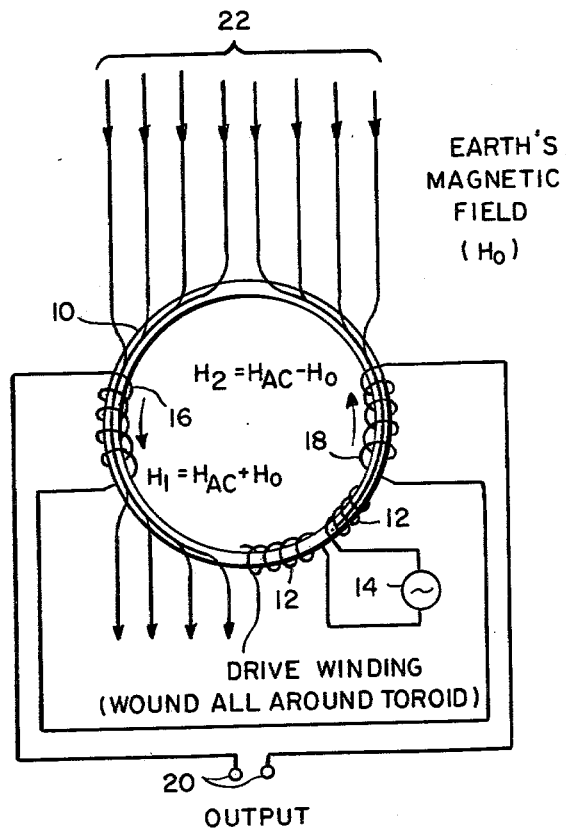
FIG. 1 illustrates the operation of a fluxgate magnetometer.

Before proceeding to a detailed description of the invention, it will be helpful to briefly review the operation of a conventional fluxgate magnetometer compass. FIG. 1 illustrates the magnetic toroidal core with the associated windings which senses the surrounding magnetic field in a fluxgage magnetometer. A core 10 of a high permeability material formed in the shape of a toroid is wound around drive coil which is uniformally wound around the core. This is illustrated by coil 12 in FIG. 1, only a portion of which is shown but which in actual practice extends around the entire circumference of the toroidal core 10. The drive coil 12 is connected to a source of alternating current 14. The output signal from A.C. source 14 is sufficiently high so that the current flowing through drive winding 12 is sufficient to saturate core 10 during at least a portion of each half cycle. Two sense windings 16 and 18 each have equal numbers of turns wound around short sections of the magnetic core 10 located 180 degrees apart on the core. Windings 16 and 18 are connected in series opposition as shown in FIG. 1, so that a constant flux in core 10 causes equal and opposite outputs from windings 16 and 18 such that the total output signal at terminals 20 from series connected windings 16 and 18 is zero.

When the magnetic core 10 is located in a uniform magnetic field, such as the earth's magnetic field, the flux lines of the magnetic field are concentrated in the high permeability core 10. This is shown in FIG. 1 by flux lines 22, which represent the earth's magnetic field. As can be seen from FIG. 1, the flux within core 10 resulting from the earth's magnetic field is in the same direction as the flux from drive winding 12 on one side of core 10 and is in the opposite direction to the flux produced by drive winding 12 on the opposite side of core 10. The half of the core on the side where the A.C. field (denoted as $H_{ac}$ in FIG. 1) and the earth's magnetic field (denoted as $H_o$) are in the same direction will saturate sooner than the other half of the core where the A.C. field and earth's field are opposed.

The output voltage from sense winding 16 and 18 is proportional to the rate of change of the magnetic flux enclosed by the windings. The only changing component of the flux within these windings is caused by alternating flux from drive winding 12. Thus, as long as the core within both windings 16 and 18 has not yet saturated, the rate of change of the flux, and hence the output voltage, is the same for each winding. When saturation occurs on one side, the rate of change of flux drops to zero and consequently the output voltage from that coil also drops to zero. The core within the opposite winding has not yet saturated so that sense coil continuous to provide an output voltage. The net output signal at terminals 20 thus goes from zero to a measureable voltage at the time at which the core within one of the sense windings saturates.

As the core and coils making up the magnetometer are rotated within magnetic field 22, the static $H_o$ flux through each of the sense coils changes due to the fewer number of flux lines of field 22 passing through the core 10 at the location of the sense coil. Since the time at which each point in the core saturates is dependent upon the magnitude of the static flux $H_o$ passing through that point, the phase and magnitude of the signal at output terminals 22 is representative of the direction of the magnetic field $H_o$ with respect to the magnetometer.

In actual practice, sense coils 16 and 18 are replaced by a single coil wound around both sections of core 10 covered by coils 16 and 18. Since it is the net flux difference within these sections of the core 10 which is being measured, the single coil is functionally equivalent to the two separate coils wound around each half. This coil senses the component of the earth's magnetic field parallel to the axis of the coil. A second sense coil is mounted at right angles to the first coil to provide one sensor assembly which can detect two orthogonal components of a surrounding magnetic field. To provide a compass, the magnetometer is gimbled so that it only detects the horizontal component of the surrounding magnetic field.

Figure 2:
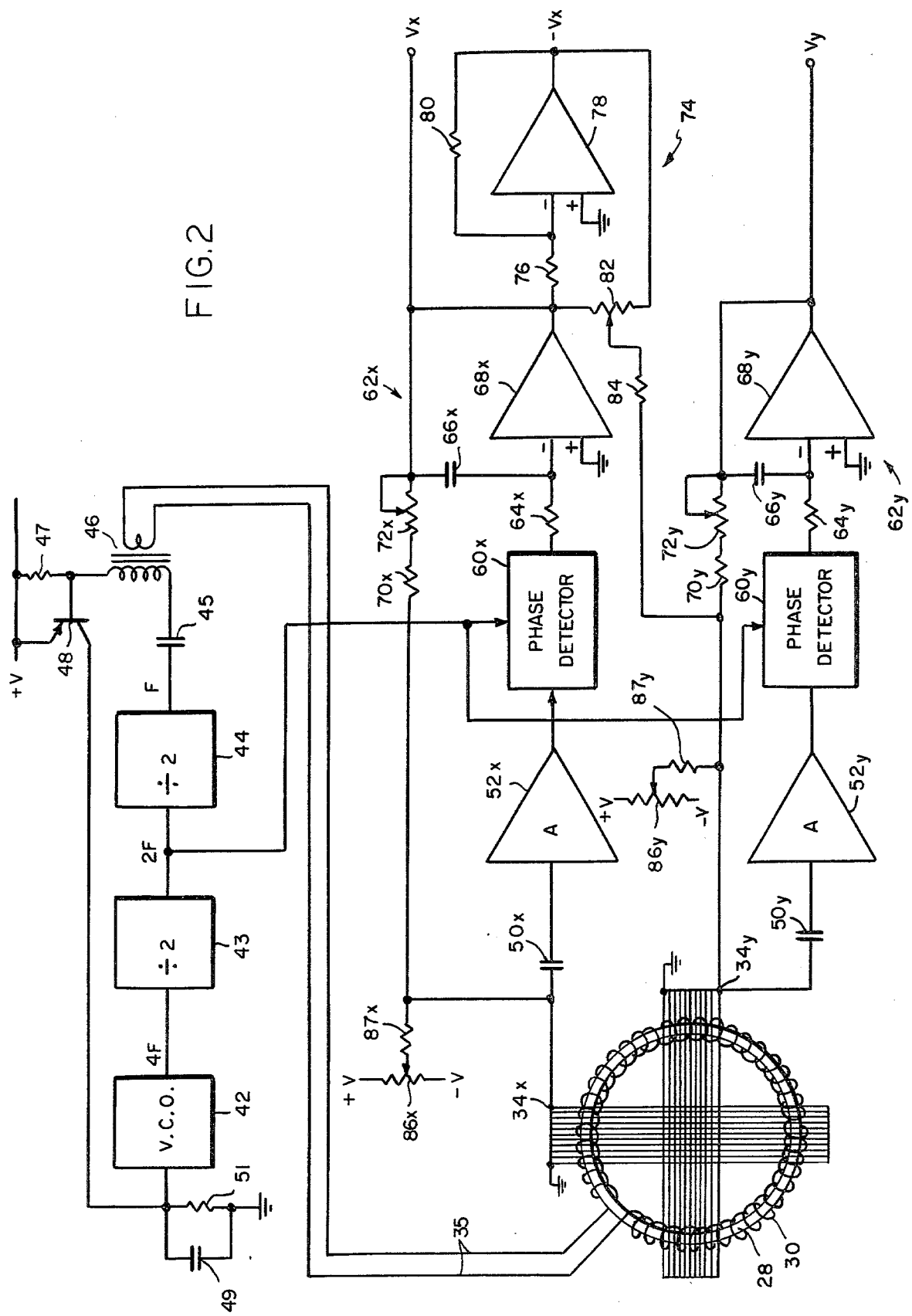
FIG. 2 is a circuit diagram of the present invention.

FIG. 2 shows one embodiment of the present invention and is described below with reference to the waveforms shown in FIG. 3. A drive winding 30 is wound around a toroidal, high-permeability magnetic core 28. Two sense windings 32 and 34 are wound around the core 28 and drive winding 30 at right angles to one another to sense orthogonal components of a surrounding magnetic field. A square wave drive voltage denoted by waveform 36 in FIG. 2 is applied in lines 35 to winding 30. The parameters of winding 30 and core 28 and the frequency and amplitude of the driving waveform 36 are chosen so that core 28 will saturate during a portion of each half cycle of the driving waveform 36. This is shown by waveform 37 in FIG. 3 which represents the flux $H_{AC}$ within core 28 in the absence of an external magnetic field. While waveform 37 shows the core saturating abruptly for purposes of explanation, it should be appreciated that in actual practice, the core will gradually satuate and the actual waveform has more rounded peaks.

The drive signal applied to drive winding 30 is provided in the following manner. A voltage controlled oscillator (VCO) 42 provides an output signal which has a nominal frequency of 4F, where F is the frequency of the signal applied to drive winding 30. In the preferred embodiment described, F is approximately 1500 Hz. The output from VCO 42 is applied to a flip flop 43 which divides the output frequency from VCO 42 by 2. Thus, the output from flip flop 43 is a symeterical square wave having a frequency of 2F, independent of any asymmetry in the output waveform from VCO 42. The output from flip flop 43 is divided by two by a second flip flop 44 which provides a square wave signal of frequency F at its output. The output from flip flop 44 is applied via a capacitor 45 to one end of the primary winding of a transformer 46. The outer end of the primary winding of transformer 46 is connected to a positive voltage supply via a resistor 47. The secondary winding of transformer 46 is connected to drive winding 30. Transformer 46 is a step-down transformer which provides a low voltage signal to drive winding 30, reducing electrostatic coupling between the drive winding and the sense windings, and eliminating the need for electrostatic shielding between the drive and sense windings which would otherwise be required. In the preferred embodiment, the turns ratio of transformer 46 is approximately 25 to 1.

Figure 3:
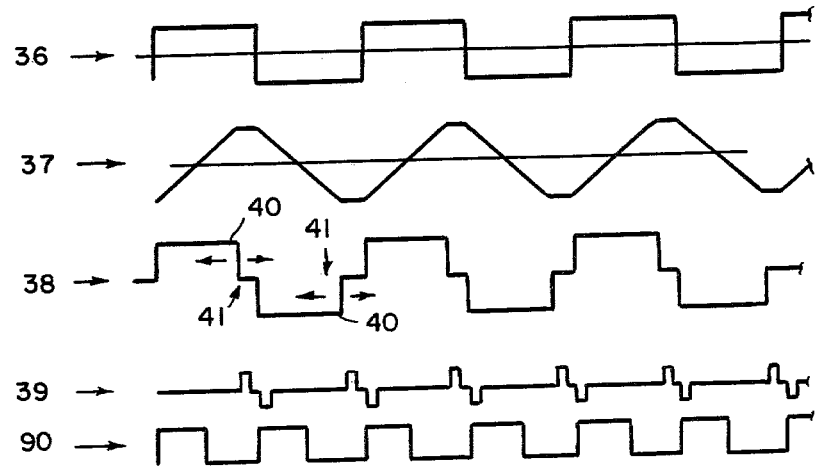
FIG. 3 shows waveform useful in explaining the operation of FIG. 2.

Referring to FIG. 3, as shown in waveform 37, the flux in core 28 should be high enough to saturate the core during a portion of the waveform. During the period that core 28 is not saturated, the impedance of drive winding 30 is mostly reactive; and very little power is dissipated by drive winding 30. However, as the core saturates, the reactive component of the impedance of drive winding 30 falls to zero, and the total impedance of drive winding 30 approaches the D.C. resistance of the winding. Thus, as drive winding 30 saturates, the current and power required by the drive winding increase very rapidly.

In order to minimize the power required by the magnetometer, the time during which the core is saturated should be kept at a minimum. However, the magnetometer core must be fully saturated to eliminate errors resulting from residual magnetism. The current required to saturate the core may vary by as much as 20 percent. This is due to parameter variations from core to core, changes in core parameters with temperture changes, and variations in core permiability caused by mechanical shock. From waveforms 36 and 37, which represent the excitation signal applied to drive winding 30 and the resulting flux, it can be seen that for a given excitation voltage, varying the frequency of the excitation signal 36 also changes the percentage of time during which core 28 is saturated. Thus, the percentage of time during which the core is saturated may be controlled by varying the frequency of the excitation signal.

Returning to FIG. 2, the current flowing in the primary winding of transformer 46 is proportional to the current flowing through the secondary winding and through drive winding 30. As the average current drawn by drive winding 30 from transformer 46 increases or decreases, the average voltage drop across resistor 47 also increases or decreases. The voltage drop across resistor 47 is applied to the base terminal of a transistor 48. The collector of transistor 48 is connected to the input terminal of VCO 42. Capacitor 49 and resistor 51 are connected in parallel between the input terminal of the VCO and ground to provide a load for transistor 48 and to provide some filtering of the voltage applied to VCO 42. The average current drawn by drive winding 30 is measured by the voltage drop across resistor 47. If the current flowing in drive winding 30 increases, the average voltage drop across resistor 47 increases. This increased voltage drop causes transistor 48 to conduct for a longer period of time changing the voltage applied to VCO 42. The polarity of the change is such that the frequency of the VCO 42 is increased causing the drive winding to saturate the core for a shorter period of time and reducing the current drawn by drive winding 30. Conversely, if the saturation period decreases, the current through resistor 47 similarly decreases turning off transistor 48. The voltage stored by capacitor 49 is discharged by resistor 51 causing the frequency of the VCO to decrease until the desired average current is again flowing through drive winding 30. In this manner the saturation time and power dissipation of the magnetometer are kept at a minimum while complete saturation of the core is ensured. In the preferred embodiment, the core is saturated approximately five percent of the time. The 2-axis magnetometer described here requires approximately 5 milliwatts of power, in contrast with conventional similar magnetometer circuits which typically require on the order of 1 or 2 milliwatts.

Referring back to FIG. 1 temporarily, for purposes of explanation, the voltages from the sense windings 16 and 18 of a conventional magnetometer, which are proportional to the rate of change of the flux passing through the winding, is shown by waveform 40. Each winding produces an output signal as shown by wave form 40, and since the windings are connected in opposite polarity, the net output at terminals 20 is zero.

In the presence of a magnetic field, one winding saturates before the other winding saturates. The output waveforms from each of the two windings would then resemble waveform 38 except that the time when the core enclosed by each winding saturates, and thus, when the output voltage falls to zero, is advanced for one winding and retarded for the other winding. Thus, in the presence of a magnetic field, the net output from terminals 20 is a pulse whose length is a function in the external magnetic field. This is shown by waveform 39 in FIG. 3. Replacing separate windings 16 and 18 by the single windings around the toroidal core shown in FIG. 2 produces the same waveform 39 at the output from the sense windings in the presence of an external magnetic field.

In the present invention, the outputs from the sense windings are applied to a servo-loop. The output of the servo-loop is applied to the sense winding so as to produce a magnetic field of the opposite polarity to the external field, the servo-loop adjusts the magnetic field so that it cancels the effects of the external field within the sense winding. Thus, in the present invention the presence of a pulse from the sense winding, such as shown in waveform 39, indicates that the surrounding magnetic field has not been exactly cancelled by the servo-loop, and such a pulse causes the servo-loop output to change in a direction which nulls the net magnetic field. Since the output from the core need not be linear over the entire range of expected external magnetic field strengths, the magnetometer of the present invention can provide complete saturation of the core while keeping to a minimum the percentage of time during which the core is saturated. This lowers the power consumption of the magnetometer, as explained below.

The output from each of the sense windings 32 and 34 are applied to individual signal processing channels designated as channel "x" and channel "y". The electronics in each of these channels is essentially identical, and the operation of only one channel is described below. It should be appreciated that the correspondingly numbered components in the opposite channel operate in the same manner.

The output from each sense winding 34 is applied via a coupling capacitor 50 to an inverting amplifier stage 52. Typically, amplifier stage 52 has a gain of 10. The output from amplifier stage 52 is applied to a phase sensitive detector 60. The 2F frequency from the drive winding oscillator 42 is applied to a second input of phase detector 60 referring to FIG. 3, waveform 90 shows the 2F signal from the drive winding excitation source. The output pulses 39 from the sense windings occur at a frequency of 2F and contain the second harmonic of the drive frequency and add harmonics thereof. The phase detector multiplies waveform 39 by the 2F square wave 90 to provide an output signal of the proper polarity to integrator 62.

The output from phase detector 60 is applied to an integrator 62, conventionally constructed of an input resistor 64 and a capacitor connected between the output and the inverting input of an operational amplifier 68. The time constant of integrator 62 is long compared to one cycle of the excitation frequency F and in the embodiment described is about 70 milliseconds.

The output from integrator 62 is fedback via a resistor 70 and potentiometer 72 to the output terminal of sense winding 34 to provide negative feedback which tends to null the output voltage from sense winding 34. In order to maintain the output voltage from sense winding 34 at zero, the net change in flux encircled by sense winding 34 must also be zero. In order for this condition to be true, there must be no static field within the winding which would cause one side of the core to saturate sooner than the other side, and thus a current must flow through sense winding 34 which produces a magnetic field which exactly cancels the component of the earth's magnetic field orthogonal to winding 34. The current flowing through winding 34 is determined by the output voltage from integrator 62 and the values of resistor 70 and potentiometer 72. Thus, the output voltage of integrator 62 is proportional to the compensating current flowing in winding 34 and is therefore representative of the component of the earth's magnetic field measured by sense coil 34. Potentiometers 86 and resistors 87 are used to compensate for any offset voltage in the output of integrators 62.

The above-described servo-loop operates in the following manner. If the compensating magnetic field produced by coil 34 does not exactly cancel the corresponding component of the earths's magnetic, one side of core 28 will saturate prior to the other side of core 28 in response to the signal on drive winding 30, and a pulse is produced at output terminal 48 of winding 32. This pulse is applied to the input of integrator 62 via a amplifier 52 and phase detector 60, and causes the output voltage integrator 68 to change in a direction which tends to cause winding 32 to null the earth's magnetic field. Over several cycles of the drive winding excitation signal, the output voltage from integrator 62 stabilizes at a voltage which causes a current to flow through winding 34 which exactly compensates for the earth's magnetic field. The gain of integrator 62 over periods of time long with respect to the integrator time constant is essentially equal to the open loop gain of operational amplifier 68. Thus, the closed loop gain of the servo-loop is very high, and there is essentially no error in the output from amplifier 68.

The result of the above-described operation is that a voltage $V_x$ is present at the output of integrator 62x which is proportional and representative of the component of the external magnetic field detected by winding 32x, and the output from integrator 62y is $V_y$ which is representative of the external magnetic field detected by sense coil 32y. The voltages $V_x$ and $V_y$ represent the angular position of the magnetometer with respect to the earth's magnetic field.

The $V_x$ output from integrator 62x is applied to a unity gain inverting amplifier 74 made up of an input resistor 76 connected to the inverting input of an operational amplifier 78 and a feedback resistor connected between the output and the inverting input of op-amp 78. The output of amplifier 78 is equal to $-V_x$ and is applied to one terminal of a potentiometer 82. The second terminal of potentiometer 82 is connected to the $V_x$ voltage at the output of integrator 62. The wiper terminal of potentiometer 82 is connected via a resistor 84 to output terminal 34y of the Y sense coil. In winding the X and Y sense coils 32, it is difficult to align the sense coils at exactly 90 degrees to one another, and a small angular error will usually exist. By adjusting potentiometer 82, the effects of this misalignment may be cancelled out.

This can be seen from the following explanation. If X sense coil 32x is slightly misaligned, its output will include voltages resulting from both X and Y components of the external magnetic field. The output from the Y channel is representative of only the Y component of the magnetic field. By properly adjusting potentiometer 82, a signal of equal magnitude but opposite polarity to the undesired Y component measured by X sense coil 32x may be added to the fedback voltage applied to sense coil 32y to compensate for the misalignment. Additionally, the misalignment causes a small reduction in the amplitude of the Y component signal, and this is compensated for by adjusting the Y channel sensitivity potentiometer 72y.

There has been described a new and improved fluxgate magnetometer circuit which has advantages over those previously known. It should be appreciated that modifications will be made by others to the preferred embodiment described herein in applying the teachings of the present application. Accordingly, the present invention is not to be limited by the disclosure of the specific circuit described above, but rather the present invention should only be interpreted in accordance with the appended claims.

What is claimed is:

1. In a magnetometer of the type having a toroidal core, a drive winding wound around the core so as to create a circumferential field within the core, drive means for driving the drive winding with an A.C. signal so that the field from the drive winding causes the core to saturate during at least a part of each cycle of the A.C. signal, and at least one sense winding and an associated signal processing channel responsive to signals from the sense winding for detecting a component of a surrounding magnetic field, the improvement comprising:
   means for sensing the current flowing in the drive winding and for producing an intermediate signal representative thereof; and
   wherein the drive means includes means, responsive to the intermediate signal, for varying the frequency of the A.C. signal so as to tend to maintain a substantially constant average current flowing in the drive winding.

2. The magnetometer of claim 1 wherein the means for varying includes a variable frequency oscillator responsive to the intermediate signal for producing an output signal having a frequency which is a function of the intermediate signal.

3. The magnetometer of claim 2 wherein the varying means includes means response to the variable frequency oscillator output signal for dividing the frequency of the variable frequency oscillator output signal to produce a symmetrical drive signal for application to the drive winding.

4. The magnetometer of claim 3 wherein the dividing means includes at least one flip flop.

5. The magnetometer of claim 3 wherein the dividing means includes two flip flops connected to provide first and second signals having first and second frequencies respectively one-half and one-fourth the frequency of the variable frequency oscillator output signal.

6. The magnetometer of claim 5 further including:
   means for applying the second signal to the drive winding; and
   a phase detector, responsive to signals from the sense winding and to the first signal, for detecting the signal applied thereto from the sense winding and for producing an output signal representative of the detected signal from the sense winding.

7. The magnetometer of claim 2 further including a second sense winding wound around the core at substantially right angles to the first sense winding and a second signal processing channel associated with the second sense winding for sensing components of a surrounding magnetic field orthogonal to the component sensed by the first sense winding.

8. The magnetometer of claim 7 further including means responsive to a signal representative of the magnetic field component sensed by one of the sense windings for adding a signal to the signal processing channel associated with the other sense winding to compensate for misalignment of the sense windings.

9. The magnetometer of claims 1, 2, 6, 7, or 8 wherein each signal-processing channel includes servo-loop means responsive to signals from the associated sense winding for applying to the associated sense winding a signal for causing the associated sense winding to produce a magnetic field which tends to null the surrounding magnetic field.

10. The magnetometer of claim 9 wherein each servo-loop means includes:
    means for integrating signals from the associated sense winding to produce an output signal representative of a component of a surrounding magnetic field; and
    means for applying the integrating means output signal to the associated sense winding.

11. The magnetometer of claim 1 further including:
    a second sense winding wound around the core at substantially right angles to the first sense winding;
    a second signal processing channel associated with the second sense winding and responsive to signals from the second sense winding for detecting components of a surrounding magnetic field orthogonal to the components sensed by the first sense winding;
    wherein each of the first and second signal processing channels include:
        means, responsive to signals from the associated sense winding for producing a DC signal representative of the magnetic field component of the surrounding magnetic field sensed by that sense winding; and
        means for applying a feedback signal proportional to the DC signal to the associated sense winding with a polarity such that the magnetic field produced by the sense winding in response to the feedback signal tends to cancel the sensed magnetic field component of the surrounding magnetic field; and wherein the magnetometer further includes means for compensating for misalignment between the first and second sense winding, comprising:

means for adding to the feedback signal produced by one of the signal processing channels and applied to the associated sense winding, a signal proportional to the DC signal produced by the other of the signal processing channels.

12. The magnetometer of claim 11 wherein the compensating means further includes means for varying the relative proportionality between the DC signal and the feedback signal between the two signal processing channels.

13. The magnetometer of claim 11 wherein the means for applying a feedback signal in each of the channels includes a variable gain stage for varying the proportionality between the DC signal and the feedback signals in each of the signal processing channels.

14. A magnetometer circuit including:

a saturable core having a permeability higher than the surrounding environment and having two sections within which flux lines of a surrounding magnetic field are concentrated;

a drive winding wound around at least the two specified sections of the core with a polarity such that a flow of current through the drive winding produces a magnetic field in the first section having flux lines which go in the same general direction through the first section as the concentrated flux lines of a surrounding magnetic field and further produces a magnetic field in the second section having flux lines which flow in the opposite general direction through the second section as the concentrated flux lines of the surrounding magnetic field;

means for driving the drive winding with an A.C. signal so that the two core sections tend to saturate during each half cycle of the A.C. signal in the absence of a surrounding magnetic field;

at least one sense winding wound around the two sections of the core so as to produce an output signal when the two-core sections saturate at different times in response to a surrounding magnetic field and the magnetic field produced by the drive winding in response to the A.C. signal applied thereto; and means for monitoring the average current flowing in the drive winding and for maintaining the average current at a substantially constant level.

15. The magnetometer circuit of claim 14 wherein the driving means includes a variable frequency oscillator for producing an A.C. output signal;

wherein the monitoring means includes means for producing an intermediate signal representative of the average current;

and further comprising means for applying the intermediate signal to the variable frequency oscillator with a polarity such that an increase in the average drive winding current causes an increase in the frequency of the variable frequency oscillator output signal.

16. The magnetometer circuit of claim 15 further including nulling means for applying a current to the sense winding to cause a magnetic field to be produced thereby which cancels a surrounding magnetic field within the sense winding.

17. The magnetometer circuit of claim 16 wherein the nulling means includes:

means for integrating the output signal from the sense winding and for providing an output signal representative thereof; and means for applying the integrating means output signal to the sense winding with a polarity to cancel a surrounding magnetic field.

18. The magnetometer circuit of claims 2, 6, 15, or 17 wherein the driving means includes a step down transformer having a primary winding to which is applied a signal derived from the variable frequency oscillator output signal, and having a secondary winding connected to the drive winding.

19. The magnetometer circuit of claim 18 wherein the monitoring means includes a resistor in series with the primary winding, the average voltage drop across the resistor being representative of the average current in the drive winding.

* * * * *